(12) United States Patent
Hasegawa

(10) Patent No.: US 8,581,472 B2
(45) Date of Patent: Nov. 12, 2013

(54) ULTRASONIC PROBE AND MANUFACTURING METHOD THEREOF

(75) Inventor: Yasunobu Hasegawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 138 days.

(21) Appl. No.: 13/273,362

(22) Filed: Oct. 14, 2011

(65) Prior Publication Data

US 2012/0112604 A1 May 10, 2012

(30) Foreign Application Priority Data

Oct. 27, 2010 (JP) ................................ 2010-240339
Sep. 22, 2011 (JP) ................................ 2011-207200

(51) Int. Cl.
*H01L 41/08* (2006.01)
(52) U.S. Cl.
USPC ......................................... 310/334; 310/335
(58) Field of Classification Search
USPC ................................................ 310/334–337
See application file for complete search history.

(56) References Cited

U.S. PATENT DOCUMENTS

| 5,296,777 | A | * | 3/1994 | Mine et al. | 310/334 |
| 5,810,009 | A | * | 9/1998 | Mine et al. | 600/459 |
| 6,822,376 | B2 | * | 11/2004 | Baumgartner | 310/365 |
| 7,795,784 | B2 | * | 9/2010 | Davidsen et al. | 310/334 |

FOREIGN PATENT DOCUMENTS

| JP | Hei6-254088 | 9/1994 |
| JP | 2009-147365 | 7/2009 |

\* cited by examiner

*Primary Examiner* — Mark Budd
(74) *Attorney, Agent, or Firm* — Edwards Wildman Palmer LLP; Scott D. Wofsy; Christopher J. Capelli

(57) ABSTRACT

A manufacturing method of an ultrasonic probe that has a signal foil made of a copper foil patterned by an additive method is provided. The manufacturing method includes preparing a base material and forming an insulating layer on a surface of the material, patterning the insulating layer by exposure, development, and peeling according to a lithographic technique, forming a cavity reaching an upper surface of the base material in the insulating layer along the patterning, forming a signal foil by performing plating in the cavity in the order of copper plating and solder plating, and demolding the formed signal foil from the cavity.

2 Claims, 9 Drawing Sheets

(a)

(b)

(a)　　　　　　　　(b)

(a)          (b)

ULTRASONIC PROBE AND MANUFACTURING METHOD THEREOF

TECHNICAL FIELD

The present invention relates to an ultrasonic probe and a manufacturing method thereof, and more specifically, relates to an ultrasonic probe using a signal foil made of a metal (copper) foil patterned by an additive method, and a manufacturing method thereof.

BACKGROUND ART

In a piezoelectric element array of a conventional ultrasonic probe, as shown in FIG. 12, a piezoelectric element array 2 including a number of piezoelectric elements 1 is arranged on a damper (backing) material 4 fitted to a damper stand 3, and electrodes 6a are alternately arranged in a staggered manner and led out by a first flexible printed board 7 which is patterned by etching. In the conventional example shown in FIG. 12, for example, the electrodes 6a of the piezoelectric elements 1 corresponding to 80 channels are led out through silver wires 9 by electrically-conducting paths 8 of the first flexible printed board 7. The first flexible printed board 7 is deposited on an external surface of the damper stand 3 and has electrode lands in two lines on the surface thereof, which are divided into four groups; each having 20 channels. Four pin connectors 12 are arranged corresponding to each of the four groups, with a reinforcing plate 11 intervening therebetween, and each electrode land and an input pin are connected to each other. Electrodes of the piezoelectric elements 1 corresponding to the remaining 40 channels are led out through the silver wires 9 by second and third flexible printed boards (not shown). The second and the third flexible printed boards are superposed on and bonded to the first flexible printed board 7 on opposite sides of the damper stand 3, and another pin connector is arranged on a point side provided on the electrode land, with the reinforcing plate 11 intervening therebetween. Electrodes 6b on a wave transmission/reception face side are commonly connected, for example, by a conductor path, and connected to the electrically-conducting path of the flexible printed board (see Patent Document 1).

In the ultrasonic probe in the conventional example having such a configuration, as described above, a flexible printed board or a solid (flat) silver foil or copper foil having a channel-divided pattern for leading out signals, is bonded to electrodes of a piezoelectric plate (a piezoelectric element array made from lead zirconate titanate, or the like) by solder, and a worker cuts (divides) a signal foil for each channel under a microscope, matched with a cut groove formed on the piezoelectric plate.

PRIOR ART DOCUMENTS

[Patent Document 1] Japanese Unexamined Patent Publication (TOKUKAI) No. Hei 6-254088
[Patent Document 2] Japanese Unexamined Patent Publication (TOKUKAI) No. 2009-147365

SUMMARY OF THE INVENTION

Problems to be Solved by the Invention

However, in such a conventional ultrasonic probe, because the flexible printed board is patterned, then after bonding with a copper foil or the like, the piezoelectric plate (piezoelectric element array) is dicing-cut, thereby being divided into desired channels. However, because a base film, a copper foil, an adhesive, and the piezoelectric element array are laminated on each other, at the time of manufacturing a probe with a fine dicing pitch, the level of difficulty of dicing cutting is quite high, and at the time of cutting, the piezoelectric elements may be broken. In addition, because the flexible printed board is hard, the piezoelectric elements may be broken due to a bending stress at the time of bending the flexible printed board and placing it in contact with side faces of the piezoelectric elements (piezoelectric plate).

Moreover, in manufacturing a signal foil by using a solid copper foil, after the piezoelectric element array has been dicing-cut, a worker needs to use a razor or the like manually to divide the copper foil for each channel (for example, into 80 channels), matched with a cut groove formed in the piezoelectric element under the microscope. Consequently, additional manufacturing man-hours are required, and the piezoelectric element may be broken due to loads at the time of division (cutting) by a razor.

Means for Solving the Problems

In order to solve the aforementioned problems, there is provided a manufacturing method of an ultrasonic probe that has a signal foil made of a copper foil patterned by an additive method, which comprises: a step of preparing a base material and forming an insulating layer on a surface of the base material; a step of patterning the insulating layer by exposure, development, and peeling according to a lithographic technique, and forming a cavity that reaches an upper surface of the base material in the insulating layer along the patterning; a step of forming a signal foil by performing plating in the cavity in the order of copper plating and solder plating; and a step of demolding the formed signal foil from the cavity.

Furthermore, in the present invention, at the time of bonding the signal foil to a piezoelectric plate, an ultrasonic radiation surface of the piezoelectric plate is designated as an upper surface, and edges of a pair of left and right signal foils are overlapped along a long axis direction of the piezoelectric plate and bonded to a lower surface of the piezoelectric plate.

Moreover, in the present invention, the piezoelectric plate having the signal foil bonded to the lower surface thereof is pressed from above, bonded to a damper material via an adhesive, and then, the signal foil is bent at right angles and placed in contact with a side face of the damper member.

Furthermore, in the present invention, at the time of bonding the piezoelectric plate to the damper member, an adhesive layer is formed on an upper surface of the damper member so that the piezoelectric plate is fully bonded to the damper member across the entire surface.

Moreover, in the present invention, at the time of bonding the piezoelectric plate to the damper member, a recess portion is formed between the piezoelectric plate and ends of the signal foils to perform bonding.

Furthermore, in the present invention, at the time of cutting the piezoelectric plate by a dicing blade to form a cut groove, first dicing is performed with a predetermined pitch to form a cut groove, and after the cut groove formed by the first dicing is filled with resin, second dicing is performed to form a cut groove, aiming at the middle of the first cut groove.

Moreover, in the present invention, at the time of layout out signal wiring on the signal foil, the signal foil and the flexible printed board are bridged by a silver wire for signal wiring in a unit of one channel, and after all the silver wires are soldered to the flexible printed board, the signal foil is soldered.

The present invention further relates to an ultrasonic probe manufactured by the afore-mentioned manufacturing method.

Furthermore, the present invention relates to an ultrasonic probe having a probe body, which comprises: a signal foil made of a copper foil patterned by an additive method; a piezoelectric plate, to a lower surface of which the signal foil is bonded; a damper member, to an upper surface of which the piezoelectric plate is bonded, with the signal foil bent at right angles and placed in contact with a side face thereof; a flexible printed board bridged to the signal foil by a silver wire for signal wiring in a unit of one channel; an acoustic matching layer provided on an upper surface of the piezoelectric plate; and an acoustic lens mounted on an upper surface of the acoustic matching layer.

The present invention relates to an ultrasonic probe comprising: the probe body; a drive element of the probe body; a feeder cable for feeding power to the drive element; and a housing for housing the probe body, the drive element, and the feeder cable.

Effects of the Invention

According to the present invention, because the signal foil is manufactured by the additive method, a signal foil having high accuracy can be obtained with high productivity, which has a finer pitch than that of a conventional flexible printed board obtained by etching a copper foil. Moreover, because the load at the time of dicing-cutting the cut groove in the piezoelectric element and the bending stress at the time of bending the signal foil decrease, defects such as breakage of the piezoelectric element decrease considerably.

BRIEF DESCRIPTION OF THE DRAWINGS

FIG. 6(*a*) is a front elevation showing a state in which a thick adhesive layer is formed in and bonded to a gap between the opposite signal foils and a lower surface of the piezoelectric plate, and FIG. 6(*b*) is a front elevation showing a state in which a thin adhesive layer is formed in and bonded to the gap and bonded to between the signal foils and the surface of the damper material and the lower surface of the piezoelectric plate, with a relief being provided.

BEST MODE FOR CARRYING OUT THE INVENTION

Figure 1:
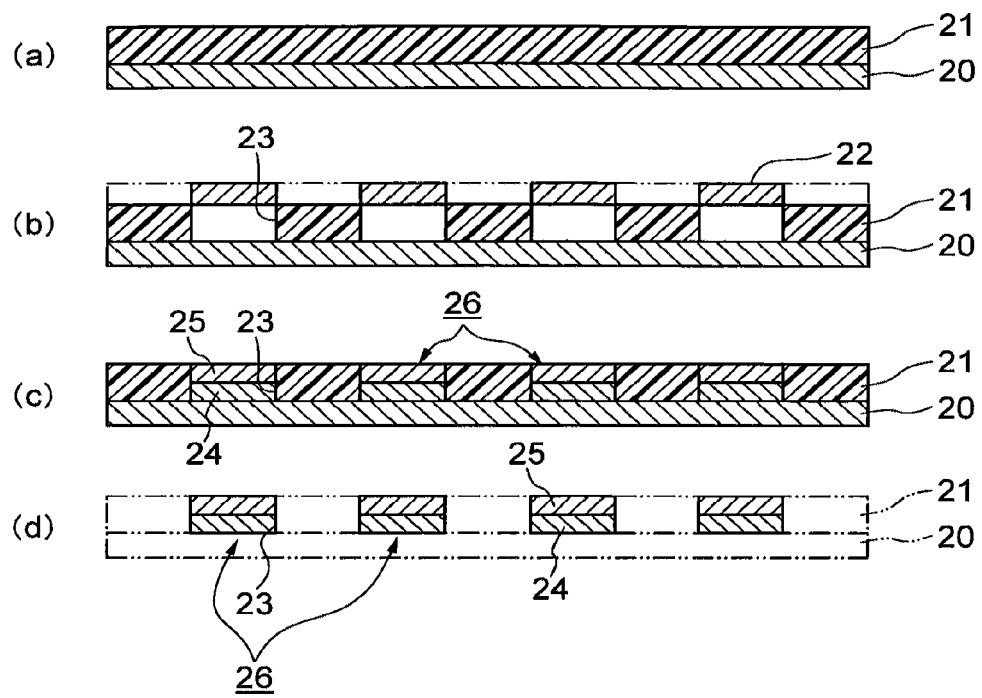
FIG. 1 is a process diagram showing the steps of a manufacturing method of a signal foil for an ultrasonic probe of the present invention according to an additive method.

FIG. 1 is a process diagram showing the steps of a manufacturing method of a signal (lead out) foil of an ultrasonic probe of the present invention by an additive method.

Here, the additive method is generally a technique for forming a conductor pattern on an insulating plate or a base film (see Patent Document 2).

In the manufacturing method of the signal foil of the present invention, the conductor pattern is formed on a stainless steel (SUS) plate instead of the insulating plate or the base film, to manufacture the signal foil.

FIG. 1 shows a longitudinal sectional view of a base material (SUS material), the insulating layer, and a plated layer used in the respective steps of the manufacturing method of the present invention.

First, in step (a), a base material (SUS material) 20 is prepared, and a negative resist is applied to the surface of the base material 20 to form an insulating layer 21.

Here, a plate-like SUS material 20 is used because electricity needs to be conducted and a product (signal foil) can be easily peeled from the base material 20 in the last step of the manufacturing process, and the thickness thereof is, for example, about 0.1 mm. A semi-cured film-like resist is used for the insulating layer 21, and the thickness thereof is about 20 μm.

Next, in step (b), the insulating layer 21 is exposed and developed via a mask 22 by a lithographic technique to peel a part of the insulating layer 21 (patterning), and a cavity 23 penetrating to an upper surface of the base material (SUS material) 20 is formed along the patterning in the insulating layer 21. Specifically, in the manufacturing method of the present invention, because a part of the insulating layer 21 is peeled to form the cavity 23 instead of etching, there is no anisotropic effect at the time of etching Consequently, the cavity 23 having inner walls parallel to the thickness direction of the base material 20 is formed.

Moreover, in step (c), plating is performed in order of Cu (copper) plating 24 and solder plating 25, thereby to form a signal foil 26 in the cavity 23.

Figure 2:
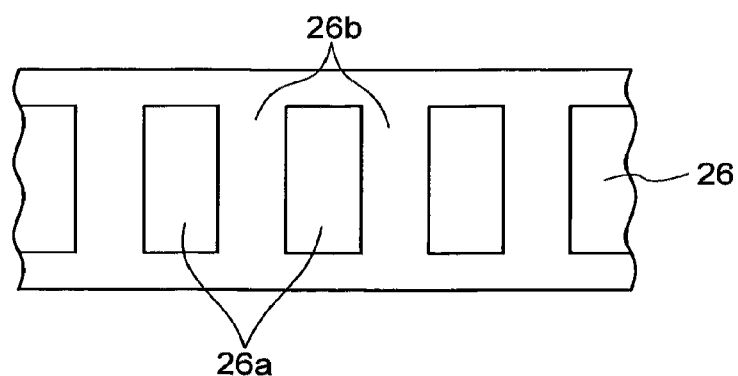
FIG. 2 is a plan view of a schematic part of the signal foil manufactured by the manufacturing method shown in FIG. 1.
Figure 3:
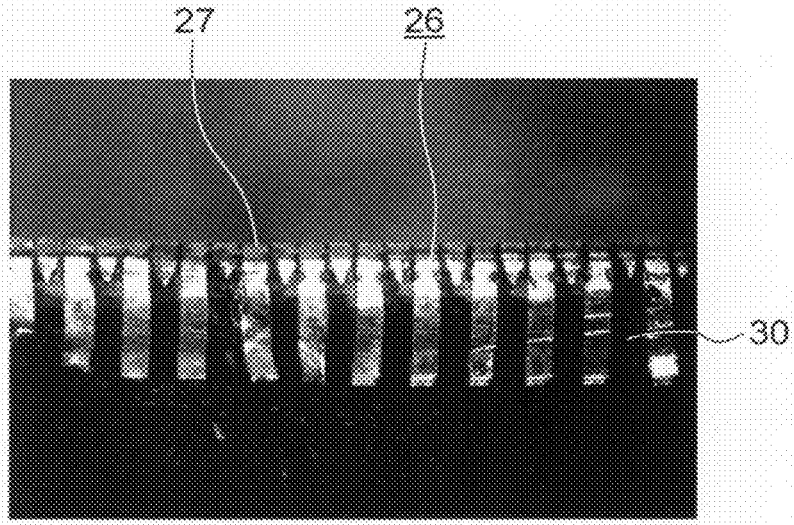
FIG. 3(*a*) is a partially enlarged photo of a signal foil manufactured by a conventional manufacturing method, and FIG. 3(*b*) is a partially enlarged photo of a signal foil manufactured by the manufacturing method of the present invention.
Figure 3:
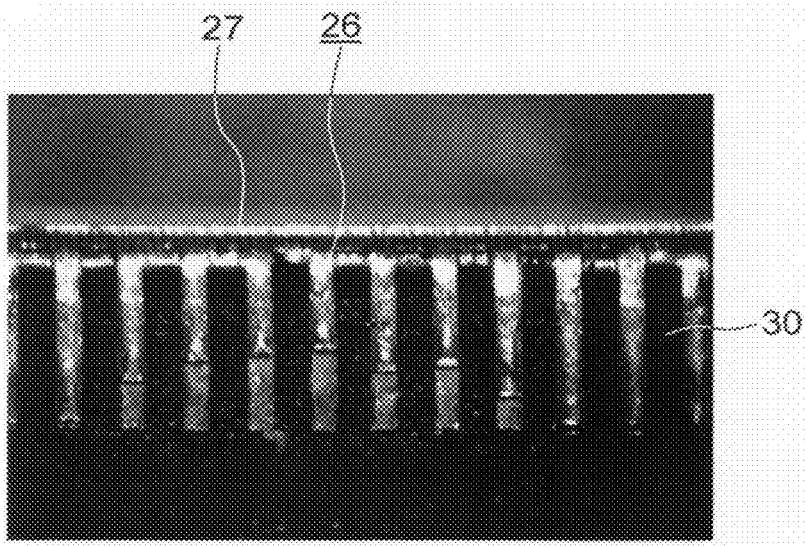

Lastly, in step (d), when the signal foil 26 formed of the Cu plating 24 and the solder plating 25 is demolded from the cavity 23, the signal foil 26 (thickness: 10 to 20 μm) having a pattern channel-divided beforehand (gap 26*a* and pattern 26*b*) as shown in FIG. 2 is manufactured.

Here, conventionally, in a flexible printed board used as a signal foil, polyimide resin is used as a base material thereof, and hence, the flexible printed board is firm and hard to bend. Consequently, a piezoelectric element may be broken due to a stress at the time of bending the flexible printed board. However, in the present invention, the SUS base material used for manufacturing the signal foil is used only at the time of manufacturing the signal foil. Accordingly, the signal foil of the probe body is formed of only a copper foil, and hence, the signal foil is soft and easily bent, thereby avoiding breakage of the piezoelectric element at the time of bending.

Figure 4:
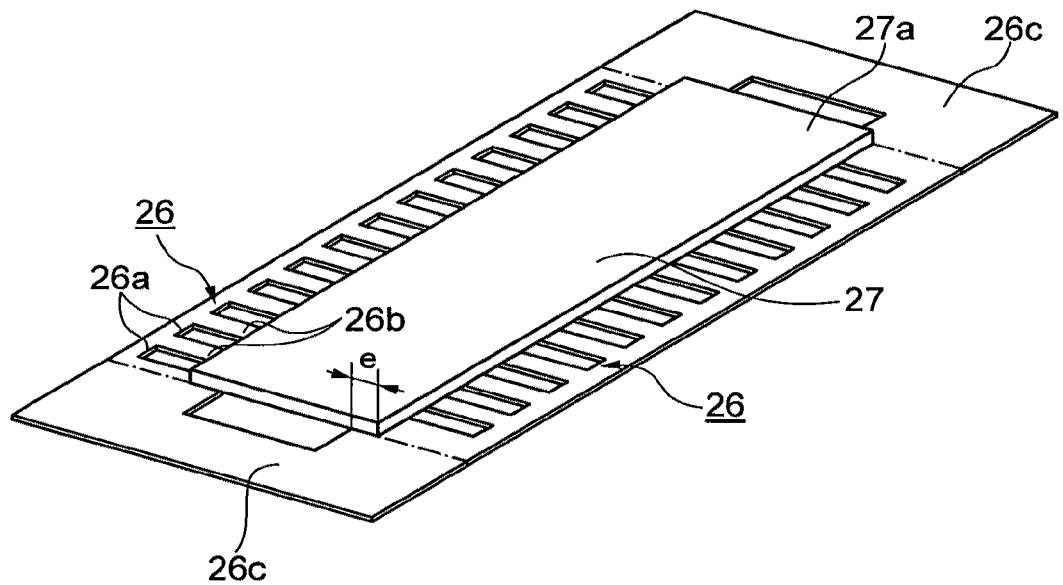
FIG. 4 is a perspective view showing a state in which a signal foil manufactured by the manufacturing method of the present invention is soldered (welded) on a piezoelectric plate.

As shown in FIG. 4, the signal foil 26 manufactured as described above, in which the gap 26*a* (width: 0.24 mm) and the pattern 26*b* (width: 0.16 mm) are formed, is bonded (welded) by a solder (solder plated in step (c) in FIG. 1) on a lower surface of the piezoelectric plate 27, with an ultrasonic radiation surface 27*a* being put on an upper side thereof.

Here, as shown by reference symbol e in FIG. 4, edges of a pair of signal foils 26 are overlapped (about 0.5 mm) along a long axis direction of the piezoelectric plate 27 and bonded thereto, and the signal foils 26 are shifted in a staggered manner to arrange a pattern, so that signals are output by separating each side (left side or right side) into odd channels and even channels. After welding, unnecessary parts of the signal foil 26 (portions 26*c* indicated by the virtual line at the opposite ends of the signal foils 26 shown in FIG. 4) are cut off.

Figure 5:
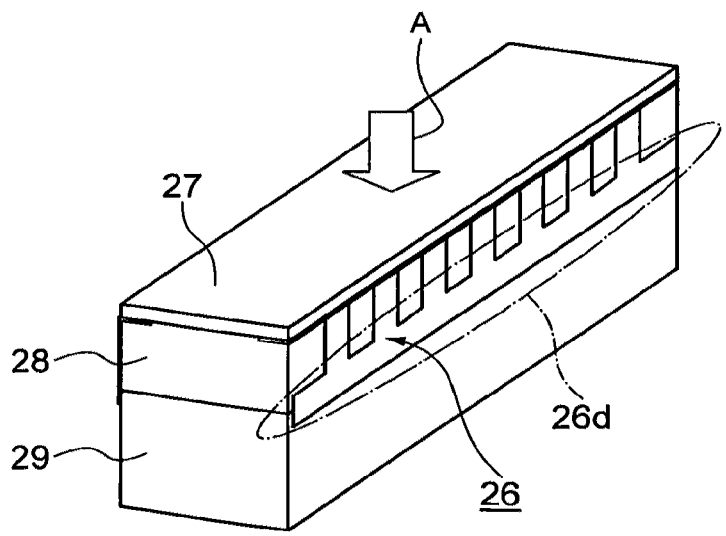
FIG. 5 is a perspective view showing a state in which the piezoelectric plate on which the signal foil shown in FIG. 4 is welded, is bonded to a damper material and the signal foil is bent at right angles so that the signal foil is placed in contact with the damper material and with the side of a damper stand.

Moreover, as shown in FIG. 5, the piezoelectric plate 27 to which the signal foil 26 is welded (solder-bonded) is pressed from the direction A (from above) shown in FIG. 5 to bond the piezoelectric plate 27, the damper material 28, and the damper stand (base) 29 to each other via an adhesive, and thereafter, the signal foil 26 is bent at right angles and placed in contact with the sides of the damper material 28 and the damper stand 29. A portion 26*d* indicated by the virtual line in FIG. 5 is cut afterward, to divide the signal foil for each channel.

Figure 6:
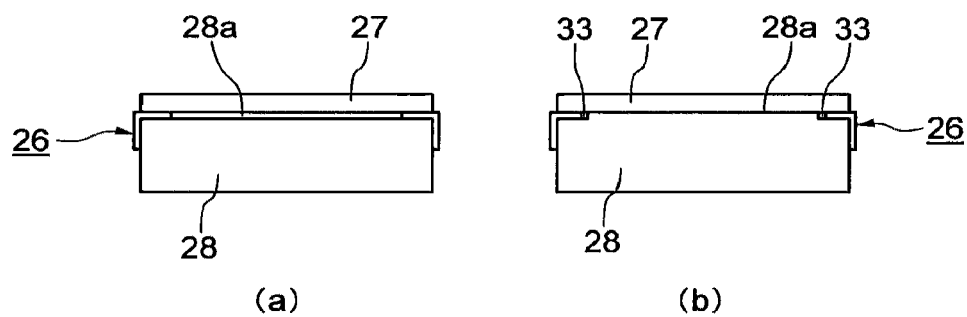
FIG. 6 shows a bonding method of the piezoelectric plate on which the signal foil manufactured by the manufacturing method of the present invention is welded.

Furthermore, at the time of welding, as shown in FIG. 6, a thick adhesive layer 28*a* is formed on an upper surface of the damper material 28, which serves as a vibration suppression material when the piezoelectric plate 27 is vibrated, by using an adhesive so that the entire surface of the piezoelectric plate 27 soldered with the signal foil 26 is bonded thereto (refer to FIG. 6(*a*)). An epoxy adhesive is suitable for the adhesive used for bonding the piezoelectric plate 27. However, a recess portion 33 can be formed between the adhesive layer 28*a* and the ends of the signal foils 26 sandwiched by the piezoelectric plate 27 and the damper material 28, so that bonding is performed by a thin adhesive according to characteristics requested by a customer (refer to FIG. 6(*b*)).

Here, the adhesive 28*a* is applied only to the surface of the damper material 28. However, after the piezoelectric plate 27 and the damper material 28 are overlapped on each other, an operation for pushing out the unnecessary adhesive and air bubbles by finger pressure of a worker is essential. At this time, the piezoelectric plate 27 may be cracked, or a predetermined position may be bonded shifted, due to pressing using a jig, thus causing a defect.

However, as shown in FIG. 6(*a*), when the adhesive layer 28*a* having the same thickness as that of the signal foil 26 is formed on the entire upper surface of the damper material 28, the sensitivity of the piezoelectric plate 27 becomes excellent. Moreover, as shown in FIG. 6(*b*), when the thin adhesive layer 28*a* is formed to bond the signal foil 26 and the recess portion 33 is formed, the sensitivity of the piezoelectric plate 27 decreases, however, vibration of the piezoelectric plate 27 is settled well (the frequency band increases).

Figure 7:
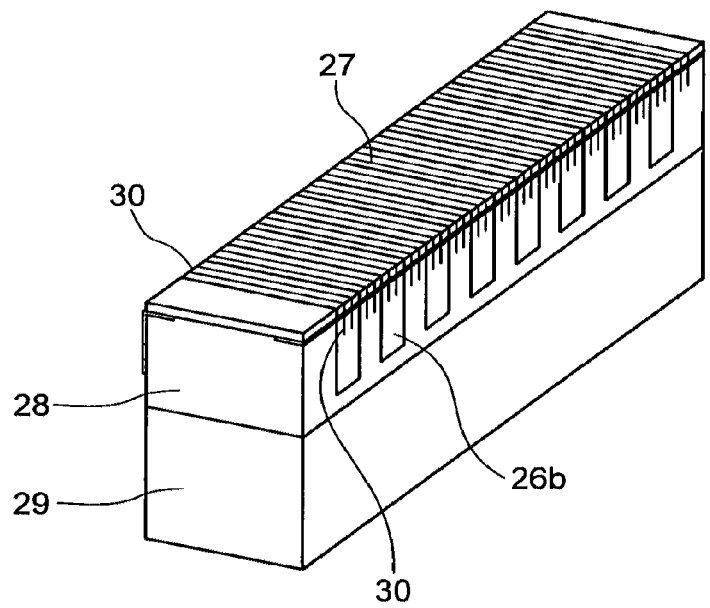
FIG. 7 is a perspective view showing a state in which a damper material to which the piezoelectric plate shown in FIG. 5 is bonded, is cut by a dicing saw to form cut grooves.

Furthermore, as shown in FIG. 7, in the piezoelectric element array in which one channel is constituted by three piezoelectric elements, for example, the piezoelectric plate 27 is cut by a dicing blade having a thickness of 25 μm or more to form cut grooves 30 in order to satisfy electrical insulation properties (DC 100V, 5 MΩ or more) in the same channels. Here, the number of piezoelectric elements and the most suitable dicing blade are selected so that the number of piezoelectric elements per channel approaches a fineness ratio (width of the piezoelectric element/thickness of the piezoelectric element: for example, 60%) of the piezoelectric plate 27 with excellent vibration efficiency.

However, in an ultrasonic probe having an exceedingly small pitch of the cut grooves 30 of the piezoelectric element, it is extremely difficult to cut all the piezoelectric elements at once (for example, when the piezoelectric element having a pitch of 0.15 mm/channel is divided into two). Here in the example described above, when all the piezoelectric elements are to be cut at once, the piezoelectric elements are cut by dicing with a pitch of 0.075 mm, but because the thickness of the piezoelectric element is thin, they become broken, thereby considerably decreasing the yield. Consequently, in the embodiment of the present invention, the first cutting is performed only between channels having a pitch of 0.15 mm, and resin is filled in the first cut groove 30 and hardened. Thereafter, the second cutting of the piezoelectric element is performed by dicing with a pitch of 0.15 mm, aiming at the middle of the first cut groove 30. Thus, cutting of the piezoelectric element is performed twice. By such a cutting method of the piezoelectric elements in which cutting is divided into two, piezoelectric elements having a narrow pitch can be cut without damaging the piezoelectric element.

Figure 8:
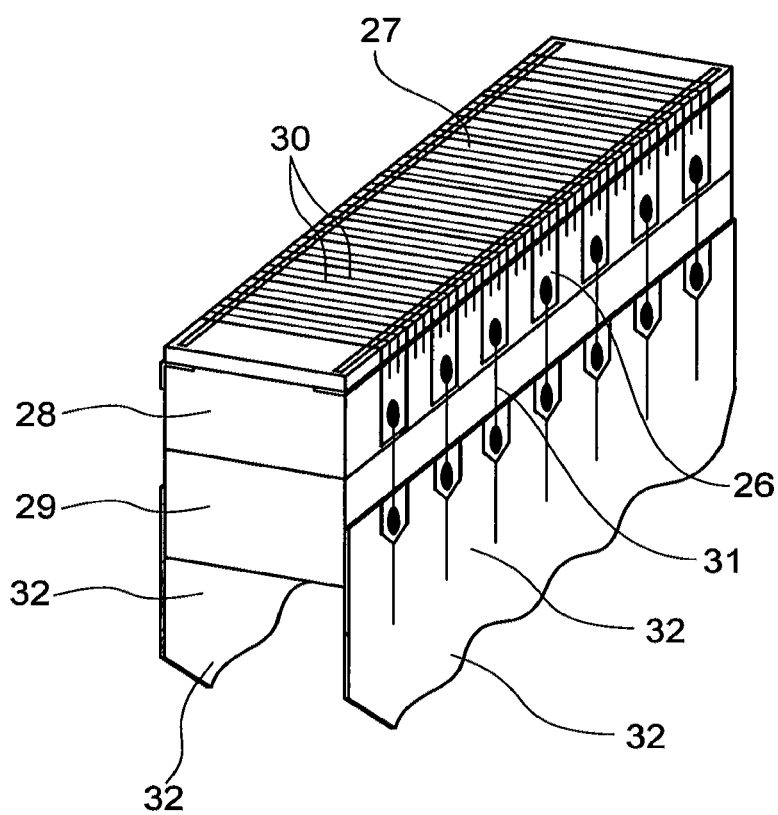
FIG. 8 is a perspective view showing a state in which signal wiring is laid out on a signal foil mounted on the damper material dicing-cut in FIG. 7.

Lastly, as shown in FIG. 8, signal wiring is laid out with respect to the signal foil 26.

That is to say, as shown in FIG. 8, the signal foil 26 and a flexible printed board 32 are bridged by a silver wire 31 for signal wiring (diameter: for example, 0.1 mm) in a unit of one channel. Therefore, because soldering is required at two positions per channel, all the silver wires 31 are first soldered on the flexible printed board 32 side, and then, the signal foil 26 is soldered.

Figure 9:
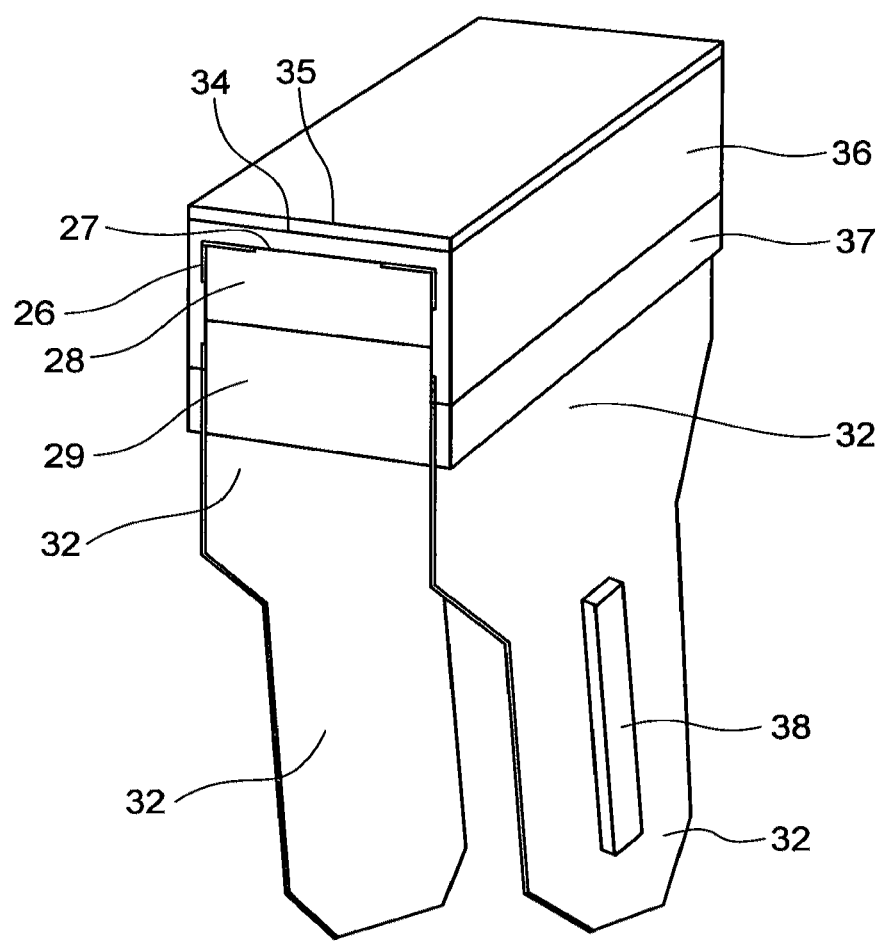
FIG. 9 is a perspective view showing a state in which an acoustic matching layer is mounted on the piezoelectric plate on which signal wiring is laid out on the signal foil shown in FIG. 8.

Moreover, in order to constitute the piezoelectric plate on which signal wiring is laid out on the signal foil shown in FIG. 8 as the probe body (sensor), as shown in FIG. 9, a first acoustic matching layer 34 is heated, pressed, and bonded on the piezoelectric plate 27 mounted on the signal foil 26 bonded to corner portions of the damper material 28 in the long axis direction, and the first acoustic matching layer 34, the damper material 28, and the damper stand 29 are covered with a side coat 36 and a side plate 37. Then, a second acoustic matching layer 35 is bonded to an upper surface of the side coat 36. Furthermore, the flexible printed board 32 for cable wiring is electrically connected to the signal foil 26, and a connector 38 that connects to a power supply is provided on the surface of the flexible printed board.

Figure 10:
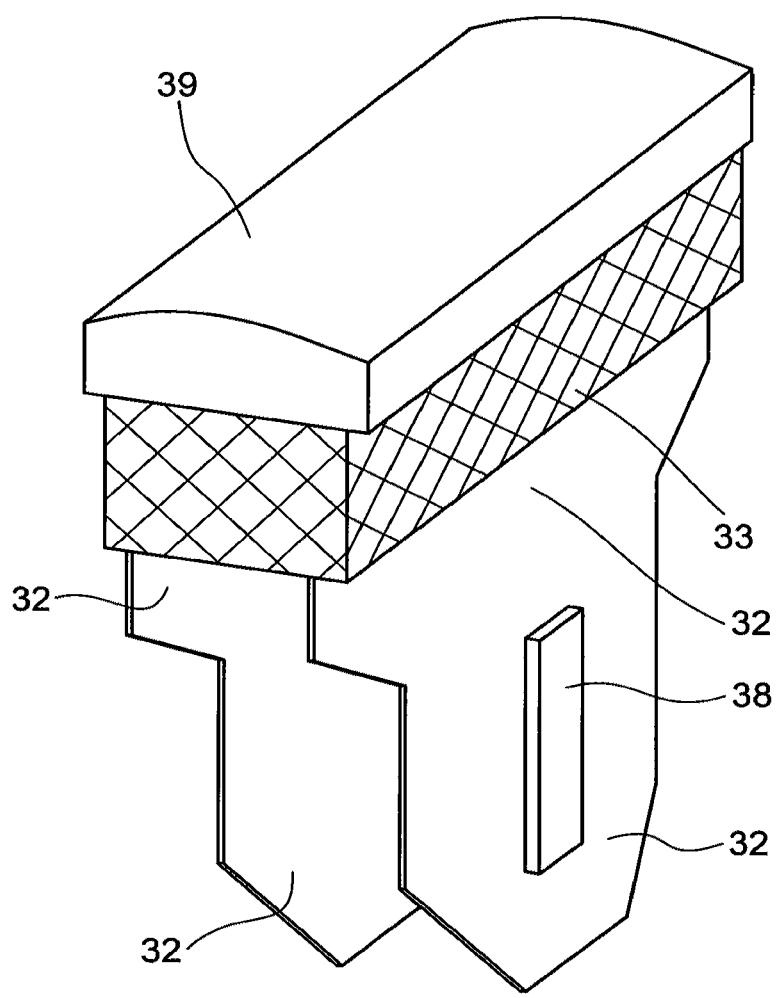
FIG. 10 is a perspective view of a probe body (sensor) constituted by bonding a shield tape to a side coat and the sides of the damper stand and the damper material shown in FIG. 9, and by mounting an acoustic lens on the acoustic matching layer.

Moreover, as shown in FIG. 10, a shield tape 33 is bonded on the surfaces of the side coat 36, the side plate 37, the damper material 28, and the damper stand 29 shown in FIG. 9, and an acoustic lens 39 is mounted on the upper surface of the second acoustic matching layer 35.

Figure 11:
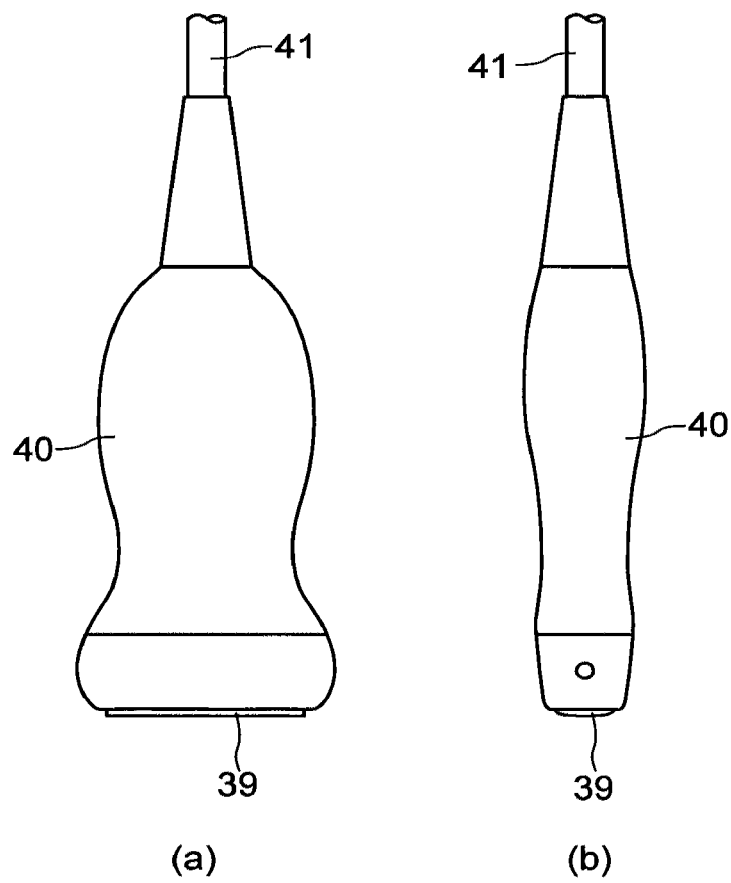
FIG. 11 shows an ultrasonic probe of the present invention in which the probe body shown in FIG. 10 is stored, FIG. 11(*a*) being a front elevation thereof, and FIG. 11(*b*) being a side view thereof.
Figure 12:
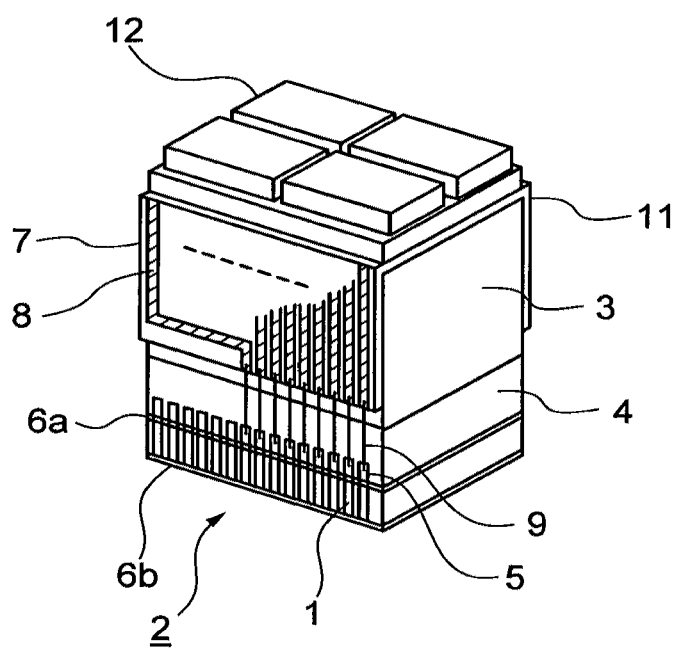
FIG. 12 is a perspective view of a piezoelectric element array of the conventionally used ultrasonic probe.

The thus constituted probe body (sensor) is housed in a housing 40 as shown in FIG. 11, and an oscillator section (drive element) is driven via a feeder cable 41.

Here, the embodiment of the ultrasonic probe of the present invention is explained above for an example of a linear array probe (electronic scanning probe). However, the present invention can be applied to a convex array probe, namely a 3D type (rotational and oscillating) probe.

Here, at the time of soldering on the signal foil side, if the soldering iron tip is applied to a bonding portion for long time, solder in a soldering portion between the signal foil 26 and the piezoelectric element will melt, thereby causing disconnection. Moreover, if the soldering iron tip is applied to the bonding portion too strongly, the signal foil 26 itself is damaged, thereby causing disconnection.

Currently, therefore, for example, the signal foil 26 on the surface of which solder plating is formed is solder-bonded to the piezoelectric element. However, instead of solder plating described above, gold plating can be applied to the surface of the signal foil 26, and the piezoelectric element and the signal foil 26 can be face-bonded by an adhesive, thereby enabling conduction.

What is claimed is:

1. An ultrasonic probe having a probe body that comprises:
   a signal foil made of a copper foil patterned by an additive method;
   a piezoelectric plate, to a lower surface of which said signal foil is bonded;
   a damper member, to an upper surface of which said piezoelectric plate is bonded, with said signal foil bent at right angles and placed in contact with a side face thereof;
   a flexible printed board bridged to said signal foil by a silver wire for signal wiring in a unit of one channel;
   an acoustic matching layer provided on an upper surface of said piezoelectric plate; and
   an acoustic lens mounted on an upper surface of said acoustic matching layer.

2. An ultrasonic probe according to claim 1, comprising:
   said probe body;
   a drive element of said probe body;
   a feeder cable for feeding power to said drive element; and
   a housing for housing said probe body, said drive element, and said feeder cable.

\* \* \* \* \*